US006191651B1

(12) United States Patent
Shrader

(10) Patent No.: US 6,191,651 B1
(45) Date of Patent: Feb. 20, 2001

(54) INDUCTIVE OUTPUT AMPLIFIER OUTPUT CAVITY STRUCTURE

(75) Inventor: Merrald B. Shrader, Buena Vista, CO (US)

(73) Assignee: Litton Systems, Inc., Woodland Hills, CA (US)

( * ) Notice: Under 35 U.S.C. 154(b), the term of this patent shall be extended for 0 days.

(21) Appl. No.: 09/267,297

(22) Filed: Mar. 15, 1999

Related U.S. Application Data

(60) Provisional application No. 60/080,007, filed on Apr. 3, 1998.

(51) Int. Cl.[7] ................................ H03F 3/54; H01J 23/40

(52) U.S. Cl. .............................. 330/44; 330/45; 333/230; 315/5; 315/5.37

(58) Field of Search .................................. 315/4, 5, 5.37; 333/230; 330/44, 45

(56) References Cited

U.S. PATENT DOCUMENTS

| | | | | |
|---|---|---|---|---|
| 2,934,672 | | 4/1960 | Pollack et al. | 315/5.46 |
| 3,214,684 | * | 10/1965 | Everitt | 333/230 X |
| 4,480,210 | | 10/1984 | Preist et al. | 315/4 |
| 4,611,149 | | 9/1986 | Nelson | 315/5.39 |
| 4,733,192 | | 3/1988 | Heppinstall et al. | 330/45 |
| 4,734,666 | * | 3/1988 | Ohya et al. | 333/230 |
| 5,239,272 | | 8/1993 | Bohlen et al. | 330/45 |
| 5,572,092 | | 11/1996 | Shrader | 315/5.37 |
| 5,581,153 | | 12/1996 | Bridges | 315/5 |
| 5,650,751 | | 7/1997 | Symons | 330/45 |
| 5,854,536 | * | 12/1998 | Langlois et al. | 315/5 |

FOREIGN PATENT DOCUMENTS

| | | |
|---|---|---|
| 0 181 214 | 5/1986 | (EP) . |
| 2 143 370 | 2/1985 | (GB) . |
| 2 243 943 | 11/1991 | (GB) . |
| 2 244 854 | 12/1991 | (GB) . |
| 2 245 414 | 1/1992 | (GB) . |
| 2 279 496 | 1/1995 | (GB) . |
| 59-099646 | 6/1984 | (JP) . |
| WO 94/24690 | 10/1994 | (WO) . |

OTHER PUBLICATIONS

"An Ultra–High Frequency Power Amplifier Of Novel Design " by A. V. Haeff, Electronics, Feb. 1939, pp. 30–32.

"A Wide–Band Inductive–Output Amplifier" by Haeff et al., Proceedings of the I.R.E., Mar. 1940, pp. 126–130.

"Wide Band UHF 10 KW Klystron Amplifier" by Goldman et al., 1958 IRE National Convention Record, Part 3, pp. 114–121.

* cited by examiner

*Primary Examiner*—Benny T. Lee
(74) *Attorney, Agent, or Firm*—O'Melveny & Myers LLP

(57) ABSTRACT

A signal output assembly for an inductive output amplifier comprises a primary output cavity including a drift tube enclosing a modulated electron beam. The density modulated beam passes across a gap separating portions of the drift tube and induces an amplified RF signal into the primary output cavity. A secondary output cavity comprises a coaxial resonator terminated in an inductive coupling loop, and a waveguide having a ridge. The coaxial resonator and the inductive coupling loop have a combined electrical length approximately equivalent to an odd multiple of one-quarter wavelengths of the input signal ($n\lambda/4$), where n is an odd integer. The coaxial resonator is electrically connected perpendicularly to a center of the ridge such that first and second portions of the ridge extend in opposite directions from the connection with the coaxial resonator to respective ends of the waveguide. The first and second ridge portions each have a length approximately equivalent to an odd multiple of one-quarter waveguide wavelengths of the input signal ($n\lambda_g/4$), where n is an odd integer. The inductive coupling loop is coupled at a first end thereof to an end of a center conductor of the coaxial resonator and at a second end thereof to an outer conductor of the coaxial resonator. The inductive coupling loop extends into the primary output cavity and is adapted to couple the amplified RF signal from the primary output cavity to the secondary output cavity. The amplified RF signal is thereafter coupled out of the secondary output cavity through a secondary inductive coupling loop.

26 Claims, 6 Drawing Sheets

FIG. 5
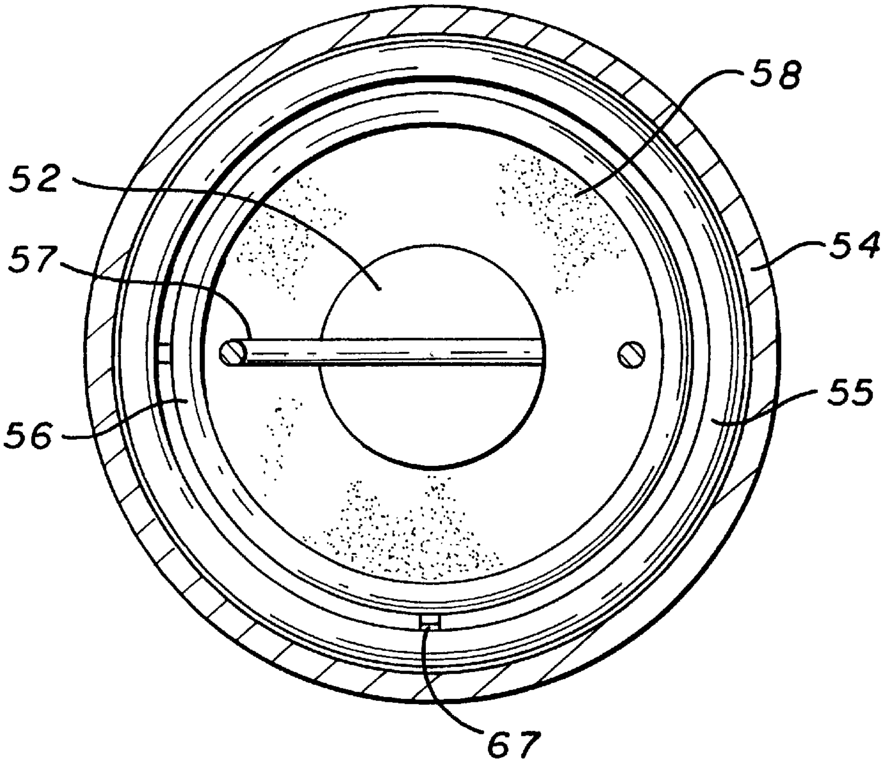
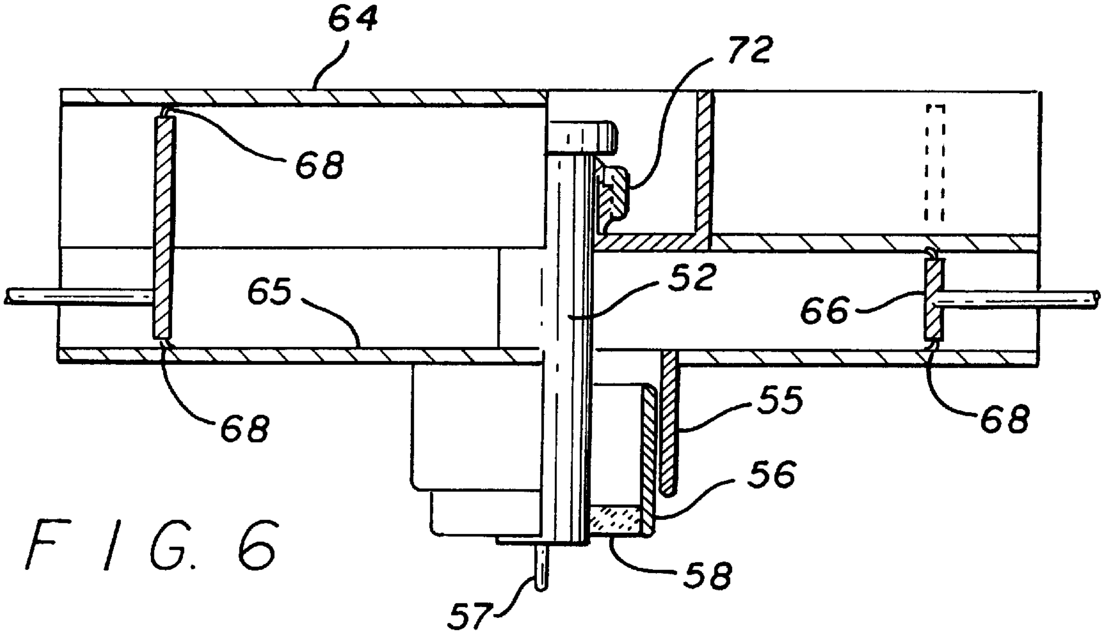
FIG. 6

INDUCTIVE OUTPUT AMPLIFIER OUTPUT CAVITY STRUCTURE

RELATED APPLICATION DATA

This application claims the benefit of U.S. Provisional Application Serial No. 60/080,007, filed Apr. 3, 1998, which application is specifically incorporated herein, in its entirety, by reference.

BACKGROUND OF THE INVENTION

1. Field of the Invention

The present invention relates to linear beam devices such as inductive output amplifiers used for amplifying an RF signal. More particularly, the invention relates to an output cavity structure for extracting an amplified RF signal from an inductive output amplifier.

2. Description of Related Art

It is well known in the art to utilize a linear beam device, such as a klystron or travelling wave tube amplifier, to generate or amplify a high frequency RF signal. Such devices generally include an electron emitting cathode and an anode spaced therefrom. The anode includes a central aperture, and by applying a high voltage potential between the cathode and anode, electrons may be drawn from the cathode surface and directed into a high power beam that passes through the anode aperture.

One class of linear beam device, referred to as an inductive output amplifier, or inductive output tube (IOT), further includes a grid disposed in the inter-electrode region defined between the cathode and anode. The electron beam may thus be density modulated by applying an RF signal to the grid relative to the cathode. After the density modulated beam is accelerated by the anode, it propagates across a gap provided downstream within the inductive output amplifier and RF fields are thereby induced into a cavity coupled to the gap. The RF fields may then be extracted from the output cavity in the form of a high power, modulated RF signal.

While inductive output amplifiers are advantageous in amplifying high frequency RF signals, such as for broadcasting television signals (e.g., 470–810 MHz tuning range with an instantaneous bandwidth of 6 MHz), the tunability within the desired range and the instantaneous bandwidth of such signals is limited by the impedance of the output cavity at the gap. To achieve wide bandwidth in klystrons, it is known in the art to use a double-tuned cavity having a tunable primary cavity which interacts with the electron beam, and a tunable secondary cavity coupled to the primary cavity. An example of a double-tuned cavity for a klystron is provided by U.S. Pat. No. 2,934,672, for "Velocity Modulation Electron Discharge Device," to Pollack et al. See also "Wide Band UHF 10 KW Klystron Amplifier," by H. Goldman, L. F. Gray and L. Pollack, IRE National Convention Record, 1958.

In the prior art double-tuned cavity disclosed by Pollack et al., the secondary cavity comprises a coaxial resonator one-half wavelength ($\lambda/2$) in length that is coupled to the primary cavity, where $\lambda$ is a wavelength of an RF output signal. An adjustable loop is disposed at one end of the coaxial resonator within the primary cavity for inductively coupling RF energy from the primary cavity to the secondary cavity. The coaxial resonator has a moveable short circuit in the secondary cavity for tuning the one-half wavelength transmission line. Energy is extracted from the coaxial resonator by a capacitative probe. Broad bandwidth operation is achieved by tuning the secondary cavity to a desired frequency range.

While the double tuned-cavity disclosed by Pollack et al. was effective for its time at relatively low power levels (e.g., around 10 KW), it is not practical for present inductive output amplifiers that are expected to operate at much higher power levels (e.g., above 30 KW). This is due in part to the relatively small circumference of the short circuit at the end of the coaxial resonator of the secondary cavity. In particular, the moveable short circuit of the secondary cavity relies upon a plurality of conductive fingers to maintain electrical contact between the circumference of the short circuit and the outer conductor of the coaxial resonator. The output current conducted through the coaxial resonator passes directly through the conductive fingers. At the high power levels expected of inductive output amplifiers, the current density may be high enough to damage the conductive fingers. It is not possible to enlarge the circumference of the short circuit to reduce the current density without altering the resonant characteristics of the coaxial resonator.

Thus, it would be desirable to provide an inductive output amplifier having a double-tuned output cavity providing a wide tuning range and an ability to handle high output current levels.

SUMMARY OF THE INVENTION

In accordance with the teachings of the present invention, a signal output assembly is provided for a linear beam amplification device, such as an inductive output amplifier. As known in the art, the linear beam amplification device provides an axially centered electron beam modulated by an RF input signal. The signal output assembly further comprises a primary output cavity in communication with a secondary output cavity. The primary output cavity encloses a drift tube through which the modulated electron beam propagates. The drift tube has a first portion and a second portion with a gap defined between the first and second portions. The density modulated beam passes across the gap and induces an amplified RF signal into the primary output cavity. In turn, the amplified RF signal is communicated from the primary output cavity into the secondary output cavity.

More particularly, the secondary output cavity comprises a coaxial resonator terminated by a loop in the primary cavity, and a waveguide having a ridge. The coaxial resonator has an electrical length equivalent to an odd multiple of one-quarter wavelengths of the input signal ($n\lambda/4$), where n is an odd integer. The coaxial resonator is electrically connected perpendicularly to a center of the ridge such that first and second portions of the ridge extend in opposite directions from the connection with the coaxial resonator to respective ends of the waveguide. The first and second ridge portions each have an electrical length equivalent to an odd multiple of one-quarter waveguide wavelengths of the input signal ($n\lambda_g/4$), where $\lambda_g$ is the wavelength of the input signal within the waveguide and n is an odd integer. An inductive coupling loop is coupled at a first end thereof to an end of a center conductor of the coaxial resonator and at a second end thereof to an outer conductor of the coaxial resonator. The inductive coupling loop extends into the primary output cavity and is adapted to couple the amplified RF signal from the primary output cavity to the secondary output cavity. The amplified RF signal is thereafter coupled out of the secondary output cavity.

A more complete understanding of the inductive output amplifier output cavity structure will be afforded to those skilled in the art, as well as a realization of additional advantages and objects thereof, by a consideration of the following detailed description of the preferred embodiment. Reference will be made to the appended sheets of drawings which will first be described briefly.

BRIEF DESCRIPTION OF THE DRAWINGS

FIG. 5 is an end sectional view of the signal output assembly, as taken through the section 5—5 of FIG. 2;

FIG. 6 is a cross sectional side view of the signal output assembly, as taken through the section 6—6 of FIG. 4;

DETAILED DESCRIPTION OF THE PREFERRED EMBODIMENT

Figure 1:
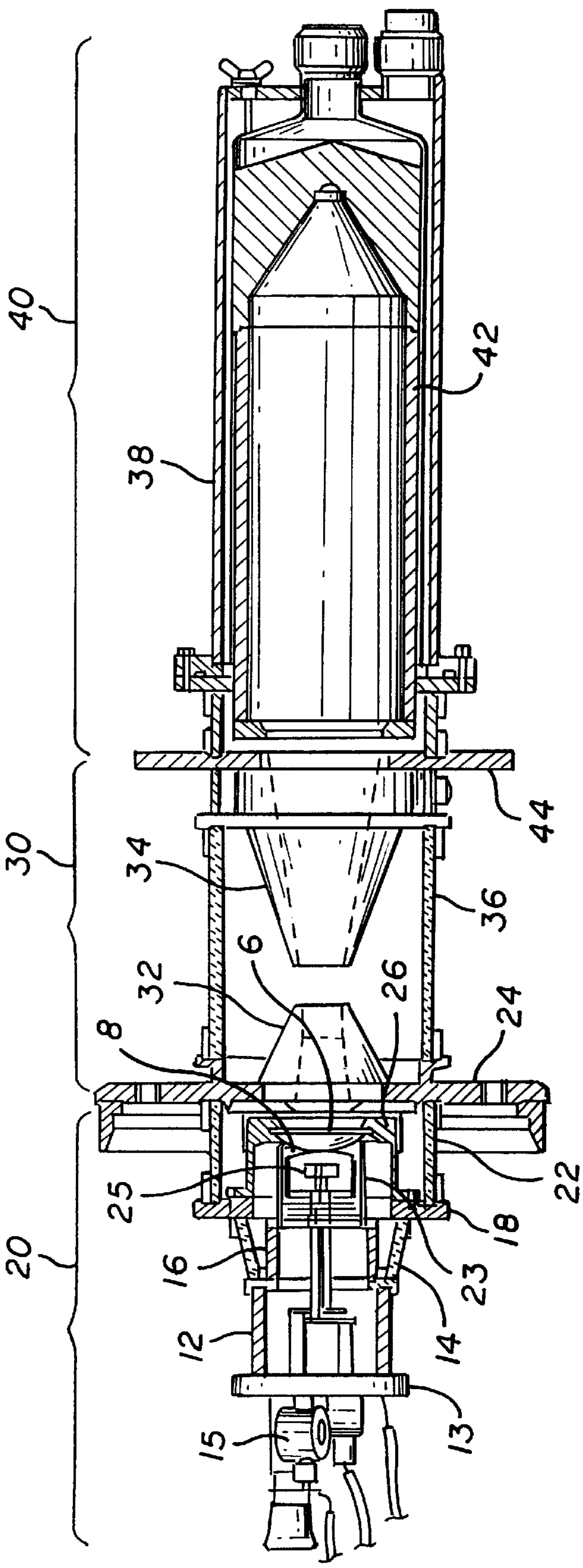
FIG. 1 is a cross-sectional side view of an inductive output amplifier in accordance with aspects of the present invention.

The present invention satisfies the need for an inductive output amplifier having a double-tuned output cavity to provide a wide tuning range and an ability to handle high output current levels. In the detailed description that follows, like reference numerals are used to describe like elements illustrated in one or more of the figures.

Referring first to FIG. 1, an embodiment of an inductive output amplifier is illustrated. The inductive output amplifier includes three major sections, including an electron gun 20, a drift tube 30, and a collector 40. The electron gun 20 provides an axially directed electron beam that is density modulated by an RF signal. An example of an inductive output amplifier is provided by copending patent application Ser. No. 09/054,747, filed Apr. 3, 1998, now issued as U.S. Pat. No. 6,133,786 on Oct. 17, 2000, the subject matter of which is incorporated in the entirety by reference herein.

The electron gun 20 includes a cathode 8 with a closely spaced control grid 6. The cathode 8 is disposed at the end of a cylindrical capsule 23 that includes an internal heater coil 25 coupled to a heater voltage source (not shown). The cathode 8 is structurally supported by a housing that includes a cathode terminal plate 13, a first cylindrical shell 12, and a second cylindrical shell 16. The first and second cylindrical shells 12, 16 are comprised of electrically conductive materials, such as copper, and are axially connected together. The cathode terminal plate 13 permits electrical connection to the cathode 8,. An ion pump 15 is coupled to the cathode terminal plate 13, and is used to remove positive ions within the electron gun 20 that are generated during the process of thermionic emission of electrons, as is well known in the art.

The control grid 6 is positioned closely adjacent to the surface of the cathode 8, and is coupled to a bias voltage source (not shown) to maintain a DC bias voltage relative to the cathode 8. An RF input signal is provided between the control grid 6 and the cathode 8 to density modulate the electron beam emitted from the cathode. The grid 6 may be comprised of an electrically conductive, thermally rugged material, such as pyrolytic graphite. The grid 6 is physically held in place by a grid support 26. The grid support 26 couples the bias voltage to the grid 6 and maintains the grid in a proper position and spacing relative to the cathode 8. An example of a grid support structure for an inductive output amplifier is provided by copending patent application Ser. No. 09/017,369, now issued as U.S. Pat. No. 5,990,622, the subject matter of which is incorporated in the entirety by reference herein.

The grid support 26 is coupled to the cathode housing by a cathode-grid insulator 14 and a grid terminal plate 18. The insulator 14 is comprised of an electrically insulating, thermally conductive material, such as ceramic, and has a frusto-conical shape. The grid terminal plate 18 has an annular shape, and is coupled to an end of the cathode-grid insulator 14 so that the cathode capsule 23 extends therethrough. The grid terminal plate 18 permits electrical connection to the grid 6. The grid support 26 includes a cylindrical extension that is axially coupled to the grid terminal plate 18. The diameter of the cylindrical extension of the grid support 26 is greater than a corresponding diameter of the cathode capsule 23 so as to provide a space between the grid 6 and cathode 8 and hold off the DC bias voltage defined therebetween.

The modulated electron beam provided by the electron gun 20 passes through the drift tube 30, which further comprises a first drift tube portion 32 and a second drift tube portion 34. The first and second drift tube portions 32, 34 each have an axial beam tunnel extending therethrough, and are separated from each other by a gap (see also FIG. 2). The leading edge of the first drift tube portion 32 is spaced from the grid structure 26, and provides an anode for the electron gun 20. The first drift tube portion 32 is held in an axial position relative to the cathode 8 and the grid 6 by an anode terminal plate 24. The anode terminal plate 24 permits electrical connection to the anode. The anode terminal plate 24 is mechanically coupled to the grid terminal plate 18 by an insulator 22 comprised of an RF transparent material, such as ceramic. The insulator 22 provides a portion of the vacuum envelope for the inductive output amplifier, and encloses the interaction region defined between the grid 6 and the anode. An RF transparent shell 36, such as comprised of ceramic materials, encloses the first and second drift tube portions 32, 34 and provides a partial vacuum seal for the device. A signal output assembly (described below) is coupled to the RF transparent shell 36 to permit RF electromagnetic energy to be extracted from the modulated beam as it traverses the gap.

The collector 40 comprises an inner structure 42 and an outer housing 38. The inner structure 42 has an axial opening to permit electrons of the spent electron beam to pass therethrough and be collected after having traversed the drift tube 30. The inner structure 42 may have a voltage applied thereto that is depressed below the voltage of the outer housing 38, and these two structures may be electrically insulated from one another. As illustrated in FIG. 1, the inner structure 42 provides a single collector electrode stage. Alternatively, the inner structure 42 may comprise a plurality of collector electrodes, each being depressed to a different voltage level relative to the cathode. An example of an inductive output amplifier having a multistage depressed collector is provided by U.S. Pat. No. 5,650,751, to R. S. Symons, the subject matter of which is incorporated in the entirety by reference herein. The collector 40 may further include a thermal control system for removing heat from the inner structure 42 dissipated by the impinging electrons.

Figure 2:
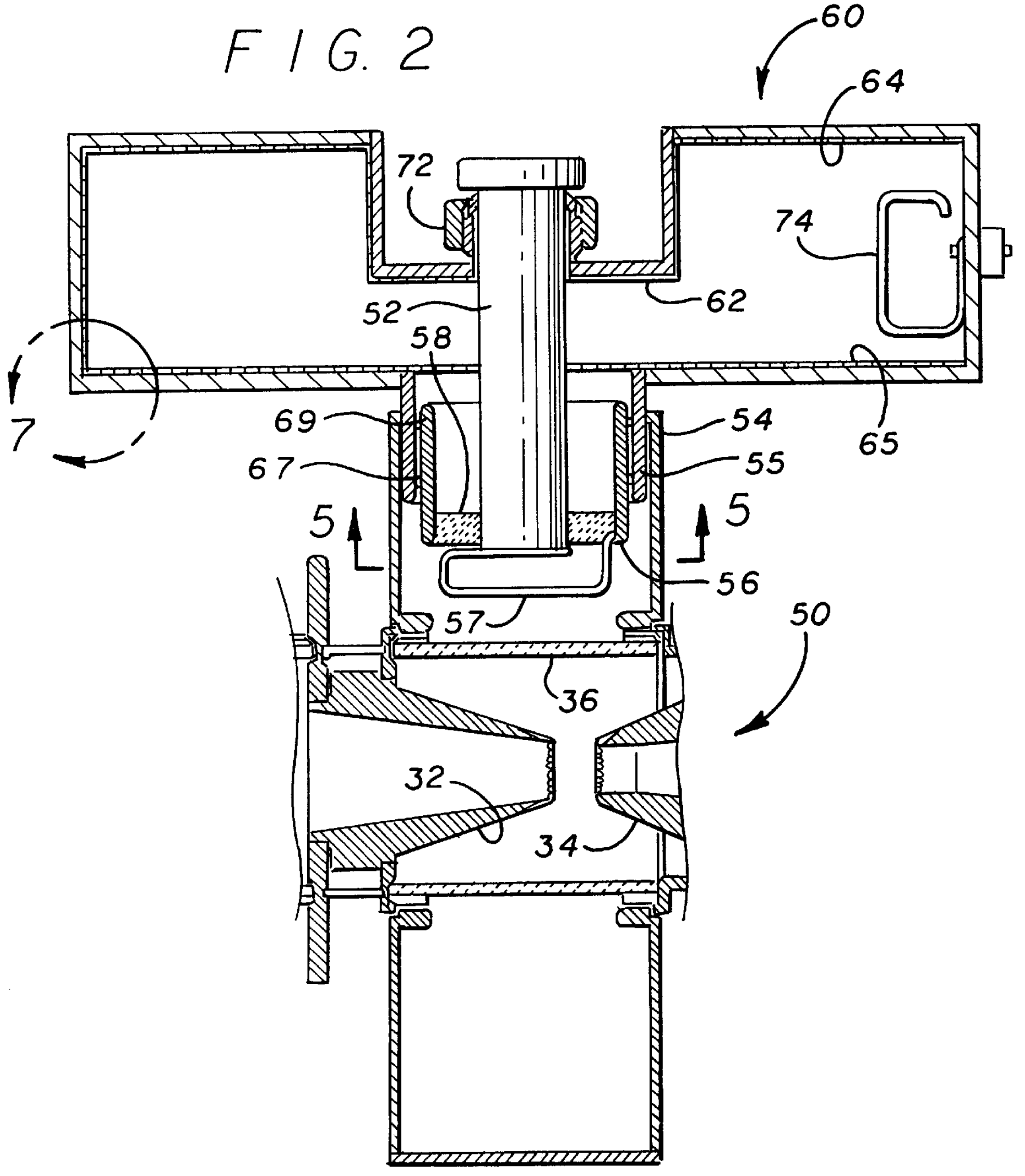
FIG. 2 is a cross-sectional side view of a signal output assembly for the inductive output amplifier including primary and secondary output cavities.
Figure 3:
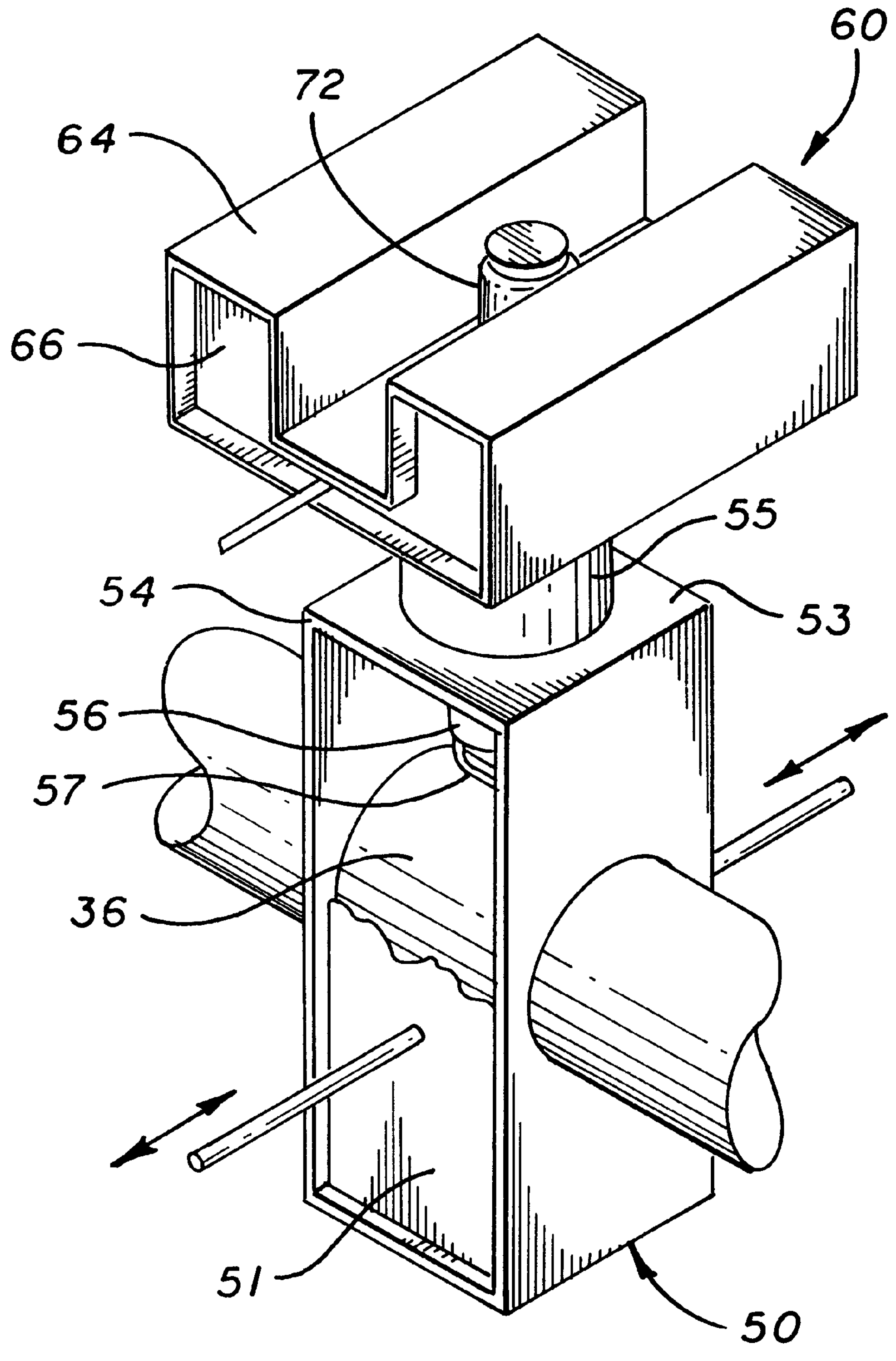
FIG. 3 is a partial perspective view of the signal output assembly.

The signal output assembly of the present invention is illustrated in greater detail in FIGS. 2–7. As shown in FIGS. 2 and 3, the signal output assembly includes a primary cavity 50 that includes the space within the RF transparent shell 36. The primary cavity 50 is generally rectangular, having outer surfaces 54 comprised of an electrically conductive material, such as copper. A front wall 51 (see FIG. 3) and a corresponding back wall (not shown) are each moveable in order to tune the resonant frequency of the primary cavity 50. These moveable walls comprise plungers that are selectively moved inward and outward using motors, threaded rods, or other like mechanical devices. The front wall 51 and back wall further include a plurality of conductive fingers extending along the outer circumference thereof to provide an electrical connection with the non-moveable outer surfaces 54 of the primary cavity 50. The conductive fingers are comprised of electrically conductive materials, and may be provided as spring-like strips that are biased into a position contacting the outer surfaces 54.

A secondary cavity 60 is coupled to the primary cavity 50 by a coaxial resonator comprising a center conductor 52 (see FIG. 2) and a telescoping outer conductor provided by cylindrical segments 55 and 56. The center conductor 52 is generally cylindrical in shape and is comprised of electrically conductive material, such as copper. The first cylindrical segment 55 of the outer conductor is in electrical contact with and extends through a top surface 53 (see FIG. 3) of the primary cavity 50. The first cylindrical segment 55 has an end facing the RF transparent shell 36 within the primary cavity 50. The second segment 56 is coupled coaxially within the first segment 55. The first and second segments 55, 56 have respective conductive fingers 67, 69 providing electrical connection therebetween as shown in FIG. 2. The second segment 56 is moveable axially and rotatably relative to the first segment 55, which remains in a fixed position. The segments 55 and 56 are comprised of electrically conductive materials, such as copper.

An inductive coupling loop 57 is disposed in the primary cavity 50, and has a first end electrically connected to the center conductor 52 and a second end electrically connected to the outer conductor at an edge of the second segment 56. An insulated washer 58 (see FIG. 2) is disposed between an end of the second segment 56 and an end of the center conductor 52, in order to provide structural coupling between the two elements. This way, the center conductor 52 and second segment 56 can move both axially and rotatably without overstressing the inductive coupling loop 57. It should be appreciated that the inductive coupling loop 57 moves axially and rotatably within the primary cavity 50 by corresponding movement of the center conductor 52 cooperatively with the insulated washer 58 and the second segment 56. Under some circumstances, the center conductor 52 of the coaxial resonator together with the inductance of the coupling loop 57 may have an electrical length equivalent to $\lambda/4$ when the segments 55 and 56 are telescoped inward to zero length. An end view of the center conductor 52, outer surface 54, cylindrical segments 55, 56, inductive coupling loop 57, insulated washer 58, and conductive finger 67 is shown in FIG. 5.

The opposite end of the center conductor 52 extends perpendicularly into the secondary cavity 60. The secondary cavity 60 comprises a rectangular waveguide 64 having an axially extending ridge 62 (see FIG. 2) to form a generally C-shaped structure when viewed in cross-section. The ridge 62 is also rectangular in shape, and extends inward into the secondary cavity 60 to define a surface parallel to and opposite from a surface 65 of the waveguide 64. The ridge 62 extends along an axial length dimension of the rectangular waveguide 64. The waveguide 64 and ridge 62 are each comprised of electrically conductive materials, such as copper. The center conductor 52 passes through an opening defined by the circumference of the first segment 55 through the surface 65 (see FIG. 2) to a central portion of the ridge 62. The first segment 55 of the outer conductor is coupled electrically to the surface 65 of the waveguide 64 directly opposite the ridge 62. The center conductor 52 protrudes through an opening (not shown) in the central portion of the ridge 62 and is electrically coupled to the ridge. A collet 72 (see also FIG. 4) is disposed on the other side of the ridge 62 outside of the secondary cavity 60, and permits the axial and rotational position of the center conductor 52 to be adjusted to a desired position and subsequently locked into place. The opening in the central portion of the ridge 62 further includes conductive finger stock (not shown) to provide an electrical connection between the ridge and the center conductor 52.

Figure 4:
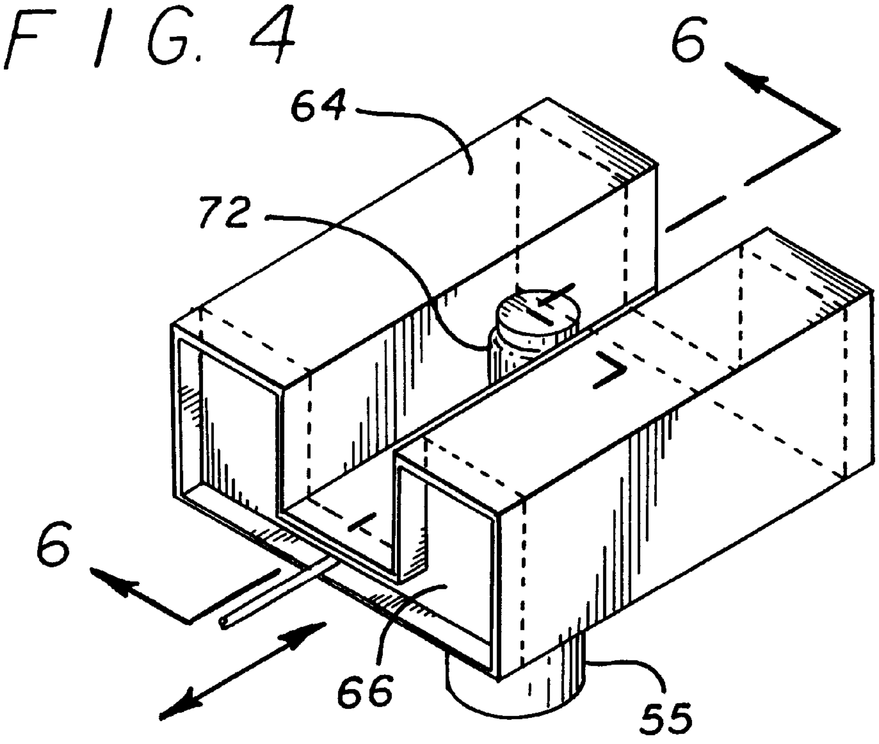
FIG. 4 is a perspective view of the secondary output cavity.
Figure 7:
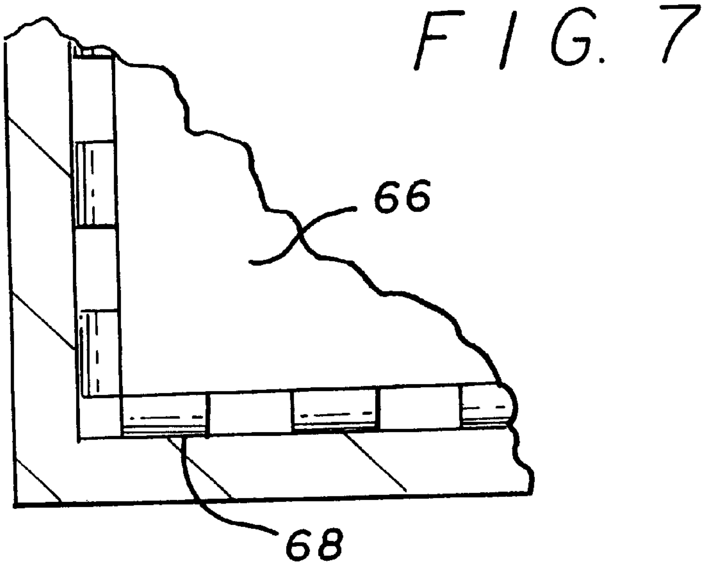
FIG. 7 is an enlarged portion of the secondary output cavity shown in FIG. 2.

As shown in FIGS. 4 and 6, the ends 66 of the waveguide 64 are moveable in an axial direction to tune the resonant frequency of the waveguide, in the same manner as the walls of the primary cavity 50. The ends 66 comprise moveable plungers that are selectively moved inward and outward using motors, cranks and threaded rods, or other like mechanical devices. The waveguide ends 66 further have a plurality of conductive fingers 68 (see FIG. 6) extending along the outer circumference thereof to provide an electrical connection with the walls of the waveguide 64 (see also FIG. 7). The conductive fingers 68 are comprised of electrically conductive materials, such as copper, and are provided as spring-like strips that are biased into a position contacting the walls of the waveguide 64. The number of and spacing between the conductive fingers 68 may be selected to accommodate the anticipated amount of electrical current conducted through the waveguide 64. A sectional view of center conductor 52, cylindrical segments 55, 56, insulated washer 58, waveguide surface 65, and collet 72 is shown in FIG. 5.

The coaxial resonator has an approximate length equivalent to an odd multiple of one-quarter wavelengths ($n\lambda/4$) of an RF output signal of the inductive output amplifier, where n is an odd integer. The position of the ends 66 of the waveguide 64 is adjusted so that the two portions of the ridge 62 extend in opposite directions by a distance that is approximately equivalent to an odd multiple of one-quarter waveguide wavelengths ($n\lambda_g/4$), where n is an odd integer. The combined characteristic impedances of the two odd multiple one-quarter waveguide wavelength ($n\lambda_g/4$) portions of the ridge 62 in parallel is roughly equal to the characteristic impedance of the coaxial resonator, so there is no reflection of RF energy at the junction between the coaxial resonator and the ridge 62. In other words, the coaxial resonator, inductive coupling loop and ridge are electrically combined to define a path length equivalent to an even multiple of one-half wavelengths of the amplified output signal ($m\lambda/2$), where m is an even integer. This configuration is better able to handle high current levels at the waveguide tuning plungers 66 than the prior art device because the current is divided between the two portions of the ridge 62. Moreover, the circumference of the moveable ends 66 of the waveguide 64 is much greater than the small circumference short circuit of the prior art device, so the current density at the conductive fingers is reduced accordingly.

As shown in FIG. 2, an inductive coupling loop 74 is provided at a side surface of the waveguide 64 to couple amplified RF energy out of the secondary cavity 60. The coupling loop 74 may be rotated within the waveguide 64 to obtain desired coupling with the RF energy in the waveguide. The RF energy from the electron beam is coupled into the primary cavity 50, and is then coupled through the center conductor 52 to the secondary cavity 60. The RF electromagnetic energy is then extracted from the secondary cavity 60 by the inductive coupling loop 74. Alternatively, it should be appreciated that capacitative probe coupling can be used instead of inductive coupling, as known in the art.

The operational theory of the inductive output amplifier output cavity structure may be understood as follows. At the junction of a number, k, of shorted, lossless transmission lines, parallel at their sending ends, the resonant condition is defined by Equation 1 as:

$$\sum_{i=1}^{k} B_i = 0$$

For a short circuited, lossless transmission line, the susceptance $B_i$ at the open sending end is defined by Equation 2 as:

$$B_i = -jY_{01}\cot(2\pi l_i/\lambda_g)$$

in which $l_i$, is the length of the ith transmission line from the open sending end to the short circuit, $Y_{01}$ is the characteristic admittance of the ith transmission line, and $\lambda_g$ is the waveguide wavelength which is equal to the freespace wavelength λ only for transverse electromagnetic modes (e.g., modes on parallel conductors or coaxial conductor transmission lines). Otherwise, the guide wavelength is defined by Equation 3 as:

$$\lambda_g = \frac{\lambda}{\sqrt{1-(\lambda/\lambda_c)^2}}$$

in which $\lambda_c$ is the longest free-space wavelength wave that can propagate in the waveguide in the chosen mode. This is called the "cutoff" wavelength. Alternatively, a cutoff frequency is defined by Equation 4 as:

$$f_c = c/\lambda_c$$

in which $f_c$ is the lowest frequency that can propagate in the waveguide and c is the velocity of light. At the cutoff wavelength or frequency, the wave resonates with the waveguide cross-section measurements, essentially bouncing back and forth between the walls of the waveguide at a right angle to the desired direction of propagation, and hence, goes nowhere. At higher frequencies, two waves travelling at equal and opposite angles of less than 90° to the waveguide axis add together to make the electric field in the middle of the waveguide intense and the fields at the side walls zero.

Figure 8:
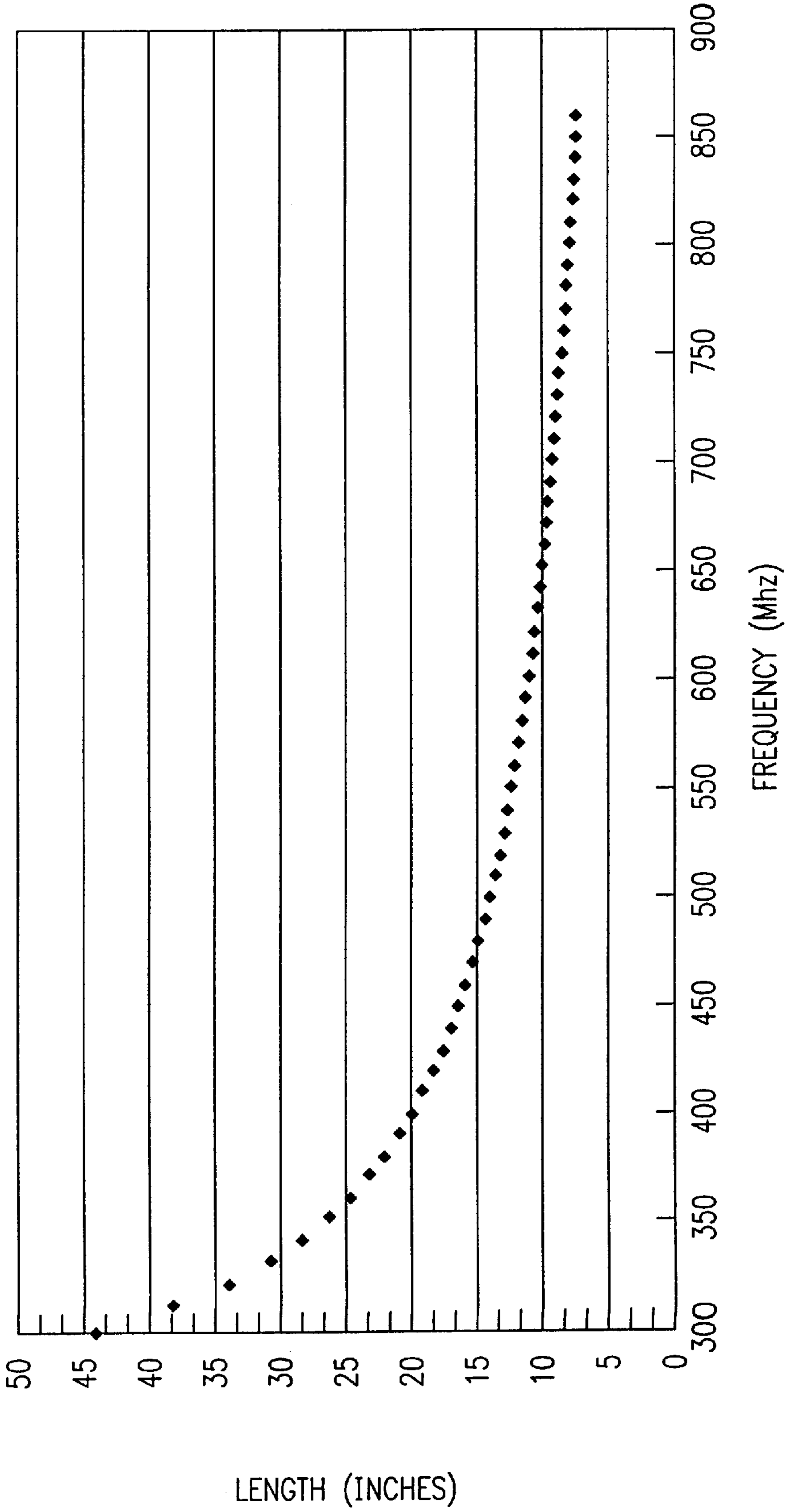
FIG. 8 is a graph illustrating the relationship between frequency and the length of the waveguide of the secondary output cavity.

In a preferred embodiment of the inductive output amplifier output cavity structure described above, the waveguide 64 has a cutoff frequency of 269 MHz and two of the shorted transmission lines (i.e., the two portions of the waveguide 64 extending in opposite directions) are approximately $\lambda_g/4$ sections of the waveguide, with the shorting planes (i.e., ends 66) spaced $\lambda_g/2$ apart. FIG. 8 is a graph illustrating the relationship between the length of the $\lambda_g/4$ sections of the waveguide and frequency over the UHF television broadcast band of 470 to 810 MHz. The graph shows the cutoff frequency as an asymptote of the curve corresponding to an infinitely long waveguide.

A third shorted transmission line (i.e., the coaxial resonator including center conductor 52 and coupling loop 57) also has a length that is adjustable, so that it can be varied across the operating band to satisfy the λ/4 condition. In practice, near the low end of the band (i.e., around 550 MHz), the length of the outer conductor of the coaxial resonator becomes very nearly zero although there is still substantial length in the center conductor and associated coupling loop. It is anticipated that sufficient tuning of the resonant frequency of the three shorted transmission lines (i=3) that define the cavity over the lower half of the band can be achieved by adjusting only the distance between the two ends 66 of the waveguide 64, without requiring further adjustment of the coaxial resonator length.

In addition, by extending the finite length of the outer conductor and also extending the center conductor by the same amount, the coaxial resonator can be provided with an electrical length of 3λ/4 in the upper half of the 470 to 810 MHz band. As noted above, the signal output device can be sufficiently tuned over the frequency range by moving only the two ends 66 of the waveguide 64, without requiring further adjustments to the length of the coaxial resonator. The ease of tuning in this manner results from the fact that the susceptance $B_i$ for the two waveguide portions in parallel is large. Thus, relatively small movements of the shorted ends of the waveguide permit the condition specified above (Equation 1) to be satisfied over a wide tuning range even if the coaxial resonator is not precisely nλ/4 long. While the inductive loop 57 on the coaxial resonator projects farther into the primary cavity when the coaxial resonator length is 3λ/4, this is actually a fortuitous result. The tuning plungers provided by the walls of the primary cavity confine the RF magnetic field to the immediate vicinity of the RF transparent shell 36 of the device at that end of the band. Therefore, the extended loop 57 is actually well placed to couple to the field.

Having thus described a preferred embodiment of an inductive output amplifier output cavity structure, it should be apparent to those skilled in the art that certain advantages of the within system have been achieved. It should also be appreciated that various modifications, adaptations, and alternative embodiments thereof may be made within the scope and spirit of the present invention. The invention is further defined by the following claims.

What is claimed is:

1. In a linear beam amplification device providing an electron beam modulated by an RF input signal, a signal output assembly comprises:

a primary output cavity receiving an amplified RF signal from said linear beam amplification device;

a secondary output cavity comprising a generally rectangular waveguide having a ridge;

a coaxial resonator coupling said primary and secondary output cavities, said coaxial resonator being electrically connected perpendicularly to a center of said ridge such that first and second portions of said ridge extend in opposite directions from a junction with said coaxial resonator to respective ends of said waveguide, said first and second ridge portions each having a respective electrical length approximately equivalent to an odd multiple of one-quarter waveguide wavelengths ($n\lambda_g/4$) of said input signal, where n is an odd integer;

first means for coupling said amplified RF signal from said primary output cavity to said coaxial resonator, said coaxial resonator and said first coupling means being adjustable to achieve a combined electrical length approximately equivalent to an odd multiple of one-quarter wavelengths (nλ/4) of said input signal; and second means for coupling said amplified RF signal out of said secondary output cavity.

2. The signal output assembly of claim 1, wherein said coaxial resonator further comprising a center conductor and an outer conductor.

3. The signal output assembly of claim 2, wherein said first coupling means further comprises a primary inductive coupling loop disposed in said primary output cavity and coupled between said center and outer conductors of said coaxial resonator.

4. The signal output assembly of claim 3, wherein said primary inductive coupling loop further comprises a first end coupled to an end of said center conductor of said coaxial resonator and a second end coupled to said outer conductor of said coaxial resonator.

5. The signal output assembly of claim 3, wherein said coaxial resonator is rotationally adjustable to select a desired rotational position of said inductive coupling loop within said primary output cavity.

6. The signal output assembly of claim 3, wherein said coaxial resonator is axially adjustable to select a desired axial position of said inductive coupling loop within said primary output cavity.

7. The signal output assembly of claim 2, wherein said outer conductor has an approximately zero minimum length.

8. The signal output assembly of claim 1, wherein said primary output cavity further comprises movable walls to adjust a resonant frequency of said primary output cavity.

9. The signal output assembly of claim 1, wherein said waveguide further comprises axially movable ends to adjust a length of said first and second ridge portions, respectively.

10. The signal output assembly of claim 9, wherein said movable ends further comprise a plurality of electrically conductive fingers disposed around a circumference thereof to provide an electrical connection between said movable ends and said waveguide.

11. The signal output assembly of claim 1, wherein said linear beam amplification device further includes a drift tube enclosing said modulated electron beam, said drift tube further comprising a first portion and a second portion, a gap being defined between said first and second portions, said modulated beam passing across said gap and thereby producing said amplified RF signal in said primary output cavity.

12. The signal output assembly of claim 1, wherein said second coupling means further comprises a secondary coupling loop disposed in said secondary output cavity.

13. A linear electron beam amplifying device, comprising:

a primary output cavity;

amplification means, responsive to a high frequency input signal, for producing an amplified output signal in said primary output cavity, said amplification means including means for generating an electron beam and means for modulating said electron beam by said high frequency input signal, said modulating electron beam interacting with said primary output cavity to thereby produce said amplified output signal in said primary output cavity;

a secondary output cavity comprising a waveguide having a ridge;

a coaxial resonator extending between said primary output cavity and said secondary output cavity, and an inductive coupling loop coupled to said coaxial resonator, wherein said coaxial resonator, said inductive coupling loop and said ridge being electrically combined and adjustable to define a path length equivalent to an even multiple of one-half wavelengths ($m\lambda/2$) of said amplified output signal, where m is an even integer, said coaxial resonator providing a transmission path for said amplified output signal from said primary output cavity to said secondary output cavity; and means for coupling said amplified output signal out of said secondary output cavity.

14. The linear electron beam amplifying device of claim 13, wherein said coaxial resonator and said inductive coupling loop have a combined electrical length approximately equal to an odd multiple of one-quarter wavelengths ($n\lambda/4$) of said amplified output signal, where n is an odd integer.

15. The linear electron beam amplifying device of claim 13, wherein said coaxial resonator is electrically connected to a center of said ridge such that first and second portions of said ridge extend in opposite directions from said connection with said coaxial resonator to respective ends of said waveguide, said first and second ridge portions each having a respective length approximately equal to an odd multiple of one-quarter waveguide wavelengths ($n\lambda_g/4$) of said input signal, where n is an odd integer.

16. The linear electron beam amplifying device of claim 13, wherein said coaxial resonator further comprises a center conductor coupled to said ridge and an outer conductor coupled to a wall of said waveguide opposite said ridge.

17. The linear electron beam amplifying device of claim 16, wherein said inductive coupling loop is disposed in said primary output cavity and has a first end coupled to said center conductor and a second end coupled to said outer conductor.

18. The linear electron beam amplifying device of claim 16, wherein said outer conductor has an approximately zero minimum length.

19. The linear electron beam amplifying device of claim 13, wherein said coupling means further comprises a second inductive coupling loop coupled to an interior surface of said waveguide.

20. The linear electron beam amplifying device of claim 13, wherein said waveguide further comprises axially movable ends to adjust a length dimension of said ridge.

21. The linear electron beam amplifying device of claim 20, wherein said movable ends further comprise a plurality of electrically conductive fingers disposed around a circumferential region thereof to provide an electrical connection between said movable ends and said waveguide.

22. The linear electron beam amplifying device of claim 13, wherein said coaxial resonator is rotationally adjustable to select a desired rotational position of said inductive coupling loop relative to said primary output cavity.

23. The linear electron beam amplifying device of claim 13, wherein said coaxial resonator is axially adjustable to select a desired axial position of said inductive coupling loop relative to said primary output cavity.

24. The linear electron beam amplifying device of claim 13, wherein said amplification means further includes a drift tube enclosing said modulated electron beam, said drift tube further comprising a first portion and a second portion, a gap being defined between said first and second portions, said modulated beam passing across said gap and producing said amplified output signal in said primary output cavity.

25. The linear electron beam amplifying device of claim 13, wherein at least a portion of said primary output cavity is provided within a vacuum envelope of said linear beam amplifying device.

26. The linear electron beam amplifying device of claim 13, wherein said primary output cavity further comprises movable walls to adjust a resonant frequency of said primary output cavity.

* * * * *